US009077346B2

(12) United States Patent
Asamura

(10) Patent No.: US 9,077,346 B2
(45) Date of Patent: Jul. 7, 2015

(54) OSCILLATOR

(71) Applicant: NIHON DEMPA KOGYO CO., LTD., Tokyo (JP)

(72) Inventor: Fumio Asamura, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/472,380

(22) Filed: Aug. 29, 2014

(65) Prior Publication Data

US 2015/0084706 A1 Mar. 26, 2015

(30) Foreign Application Priority Data

Sep. 24, 2013 (JP) ................................ 2013-196987
Jun. 10, 2014 (JP) ................................ 2014-119307

(51) Int. Cl.
*H03L 1/02* (2006.01)
*H03B 5/30* (2006.01)
*H01L 23/495* (2006.01)

(52) U.S. Cl.
CPC .. *H03L 1/02* (2013.01); *H03B 5/30* (2013.01); *H01L 23/49596* (2013.01)

(58) Field of Classification Search
CPC .................................. H03L 1/02; H03B 5/30
USPC .................... 331/70, 107 R, 116 R, 154, 158
See application file for complete search history.

(56) References Cited

U.S. PATENT DOCUMENTS 6,587,008 B2 * 7/2003 Hatanaka et al. ............... 331/68
7,057,331 B2 * 6/2006 Shimodaira et al. .......... 310/344
2013/0135055 A1 * 5/2013 Harima .................... 331/116 R

FOREIGN PATENT DOCUMENTS

JP 2007-057272 3/2007
JP 2013-219738 10/2013

* cited by examiner

*Primary Examiner* — Joseph Chang
*Assistant Examiner* — Jeffrey Shin
(74) *Attorney, Agent, or Firm* — Jianq Chyun IP Office

(57) ABSTRACT

An oscillator according to the disclosure includes a crystal unit, an IC chip, an adhesive agent flow prevention film, and a lead frame. The lead frame is disposed in a peripheral area of the pair of crystal terminals and the IC chip in an approximately same surface as the one surface of the flat container of the crystal unit. The lead frame includes a wiring part that is connected to an IC terminal of the IC chip by a bonding wire and is buried in the resin mold, and a mounting terminal forming portion that extends from the wiring part and is folded along an outside of the resin mold in a back surface that is another surface side opposite to the one surface of the crystal unit so as to form a mounting terminal.

2 Claims, 7 Drawing Sheets

1
4
4b
4a
8
2
7
3
7
5a
5b
6
4
4
A 4a
6
3
4a
7
8
5a
5b
2
4b
9
9
4b
2c
B 4b
4b
8
9
9
9
9
4b
4b (b)

OSCILLATOR

CROSS-REFERENCE TO RELATED APPLICATIONS

This application claims the priority benefit of Japan application serial no. 2013-196987 filed on Sep. 24, 2013 and no. 2014-119307 filed on Jun. 10, 2014. The entirety of the above-mentioned patent applications are hereby incorporated by reference herein and made a part of this specification.

TECHNICAL FIELD

This disclosure relates to a crystal oscillator, especially relates to an oscillator using a tuning-fork type crystal resonator.

DESCRIPTION OF THE RELATED ART

Among oscillators using a crystal resonator as an oscillation source, an oscillator (hereinafter referred to as a tuning-fork type crystal oscillator) using a tuning-fork type crystal resonator is often used as a reference clock for system integration (for example, the clock frequency of 32.768 kHz, or half the frequency of 16.384 kHz) in mobile phones, multi-functional mobile phones (what is called, mobile terminals), or navigation devices.

Most of such portable information terminals (hereinafter referred to as mobile terminals) often incorporate a camera function as part of multi-functionalization. In particular, the camera incorporated in lightweight mobile terminals is required to prevent a camera shake which occurs in shutter operation. As one of the means to fulfill this request, it is known to use an angular velocity sensor using the tuning-fork type crystal oscillator.

The tuning-fork type crystal resonator constituting the tuning-fork type crystal oscillator has an oscillation frequency, which depends on the ratio of the length to the width side of tuning-fork arms. The tuning-fork crystal resonator constituting the tuning-fork type crystal oscillator, which oscillates the aforementioned 32.768 kHz and is heavily used as the clock signal source for the mobile terminal, has a relatively long size in the longitudinal direction, and a crystal unit housing the tuning-fork resonator is a rectangular in plan view and has the outside shape of flat container. Furthermore, the crystal unit has a larger size in plan view than an IC chip on which an oscillator circuit generating the required frequency signal based on the oscillation signal of the tuning-fork resonator, an output buffer circuit, a temperature compensation circuit and others are integrated.

The oscillator using such the tuning-fork resonator has the tuning-fork crystal unit on which the IC chip is bonded with an adhesive agent. Then, for connecting terminals of the IC chip (IC terminals) and output terminals (mounting terminals), a lead frame is used. After connecting the terminals using the lead frame, a resin-molding is performed to provide as a single electronic part. After the resin molding, the lead frame goes through a cut off process of unnecessary portion, and is folded on the back surface of the oscillator unit to be used as the mounting terminal.

In a mobile terminal incorporated in the camera, there is a need to supply a reference clock signal to each of a communication mechanism portion and a camera mechanism portion. A conventional technique provides these communicate mechanism portion and camera mechanism portion for their own oscillators. Each oscillator uses a similar clock oscillation output frequency. The idea to commonalize these two oscillators was also proposed to improve the mounting efficiency. This type of conventional technique is disclosed in Japanese Unexamined Patent Application Publication No. 2007-57272.

When the IC chip is integrated into the tuning-fork type crystal unit, an adhesive agent is applied over the terminal forming surface of the tuning-fork oscillator unit to bond the surface opposite to the integrated circuit forming surface of the IC chip. When applying the adhesive agent and mounting the IC chip, there are cases where a part of the applied adhesive agent flows over the terminals (crystal terminals) of the tuning-fork type crystal unit. If the adhesive agent flows over the crystal terminals, the film of the adhesive agent, which is an insulating material, disrupts the electrical connection with the IC chip terminals (IC terminals), resulting in one of the causes that render the tuning-fork type crystal unit a bad quality item.

Furthermore, if the lead frame is connected to the IC terminals of the IC chip with wires, and is fold to the IC mounting surface side to become the mounting terminal after the resin molding, the output frequency may varies after the mounting on the base plate of applying equipment. Specifically, the crystal terminals and an IC pad inside the oscillator come close to the base plate of the applying equipment, increasing the stray capacity. This may decreases the output frequency.

A need thus exists for an oscillator which is not susceptible to the drawbacks mentioned above.

SUMMARY

An oscillator according to the disclosure includes a crystal unit, an IC chip, an adhesive agent flow prevention film, and a lead frame. In the crystal unit, a tuning-fork type crystal resonator is sealed in a flat container rectangular in plan view and a pair of crystal terminals is formed in one surface of the flat container. A surface opposite to an integrated circuit forming surface of the IC chip is bonded by an adhesive agent between the pair of crystal terminals on the one surface where the crystal terminal in the flat container of the crystal unit is formed, and the crystal unit and the IC chip are coated with a resin mold to render a single electronic component. The adhesive agent flow prevention film is placed between each of the pair of crystal terminals and the IC chip to prevent the adhesive agent from flowing toward the pair of crystal terminals. The lead frame is disposed in a peripheral area of the pair of crystal terminals and the IC chip in an approximately same surface as the one surface of the flat container of the crystal unit. The lead frame includes a wiring part that is connected to an IC terminal of the IC chip by a bonding wire and is buried in the resin mold, and a mounting terminal forming portion that extends from the wiring part and is folded along an outside of the resin mold in a back surface that is another surface side opposite to the one surface of the crystal unit so as to form a mounting terminal.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

A description will be given of embodiments of the oscillator according to this disclosure with reference to the following drawings.

Embodiment 1

Figure 1:
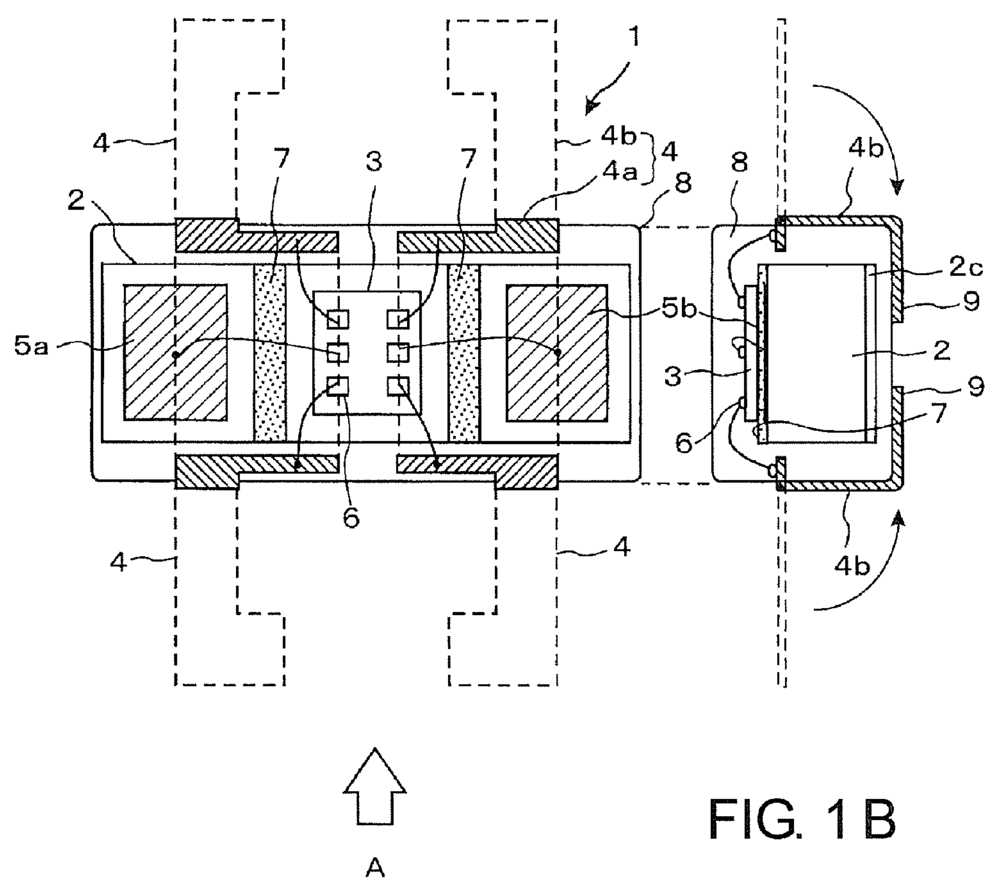
FIG. 1A is a top view illustrating an oscillator according to Embodiment 1 of the disclosure.
FIG. 1B is a side view in a short side illustrating the oscillator according to Embodiment 1 of the disclosure.
Figure 2:
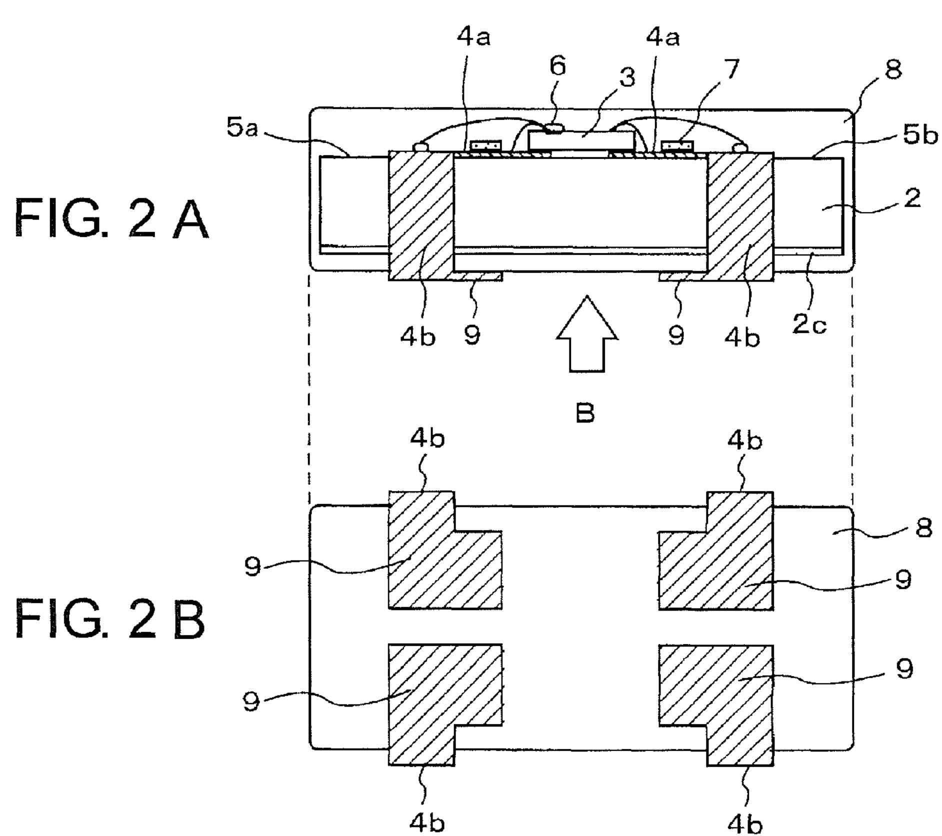
FIG. 2A is a side view in a long side illustrating the oscillator according to Embodiment 1 of the disclosure.
FIG. 2B is a bottom view illustrating the oscillator according to Embodiment 1 of the disclosure.

FIGS. 1A and 2B are explanatory drawings of Embodiment 1 of the oscillator according to this disclosure. FIG. 1A is a top view of the oscillator, and FIG. 1B is a side view in the short side of the oscillator. Similarly to FIG. 1A, FIG. 1B, FIG. 2A, and FIG. 2B is an explanatory drawing of Embodiment 1 of the oscillator according to this disclosure. FIG. 2A is a side view in the long side viewed from the direction of arrow "A" in FIG. 1A. FIG. 2B is a bottom view viewed from the direction of arrow "B" in FIG. 2A.

Figure 6:
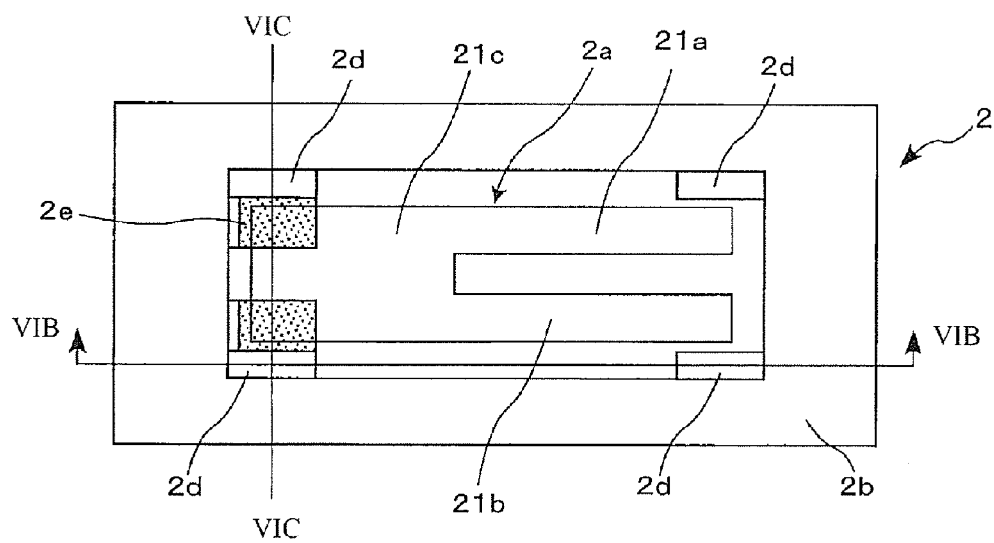
FIG. 6A is an explanatory view illustrating an exemplary configuration of a tuning-fork type crystal unit constituting the oscillator according to this disclosure.
FIG. 6B is a cross-sectional view of the tuning-fork type crystal unit taken along the line VIB-VIB of FIG. 6A.
FIG. 6C is a cross-sectional view of the tuning-fork type crystal unit taken along the line VIC-VIC of FIG. 6A.
Figure 6:
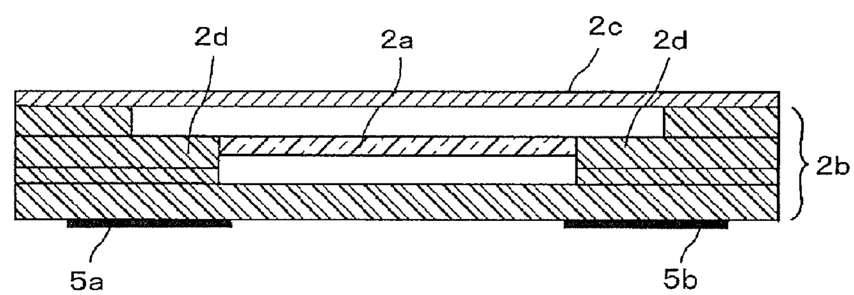
Figure 6:
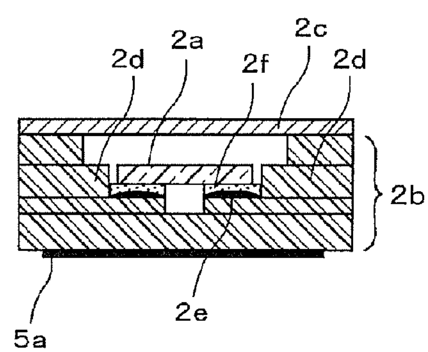

In FIG. 1A, FIG. 1B, FIG. 2A, and FIG. 2B, reference numeral "1" indicates the oscillator, reference numeral "2" does the tuning-fork crystal unit, and reference numeral "3" does the IC chip. The tuning-fork type crystal unit 2 includes a concave ceramic container internally housing the tuning-fork type resonator (the tuning-fork type crystal resonator). After housing the tuning-fork type resonator, the opening portion of the concave ceramic container is sealed with a metal cover formed from metal plate. The details of the tuning-fork type crystal unit 2 will be described later in FIGS. 6A to 6C.

The tuning-fork type crystal unit 2 is rectangular in plan view, and has a pair of crystal terminals 5*a* and 5*b* on both end faces in the longitudinal direction of one surface (the top surface). These crystal terminals 5*a* and 5*b* are oscillation signal output terminals of the tuning-fork type resonator and are formed by a thin metal film of high conductive metallic material such as gold (Au). Between the crystal terminals 5*a* and 5*b* on the top surface, an IC chip 3 is bonded with an adhesive agent. The IC chip 3 is so-called a bare chip, and is provided with terminals (IC terminals) 6 on its integrated circuit forming surface.

Along the long side in the top surface of the tuning-fork type crystal unit 2, a lead frame 4 is disposed. Inside of the lead frame 4 (the portion adjacent to the IC chip) are wiring parts 4*a*, and in the side far from the IC chip 3 are mounting terminal forming portions (or the mounting terminal connecting portions) 4*b*. The mounting terminal forming portion) 4*b* is indicated with dashed lines. The portion of the lead frame 4, which is cut off after wiring, is not indicated in the drawing.

On the surface of the tuning-fork type crystal unit 2, an adhesive agent flow prevention film 7 is formed between the crystal terminals 5*a* and 5*b* and the IC chip 3. The adhesive agent flow prevention film 7 is formed before the application of the adhesive agent which is used to bond the IC chip 3. Usually, the application is performed by such means as a quantitative liquid discharge apparatus. The adhesive agent flow prevention film 7 prevents excess adhesive agent from flowing over or protruding out of the crystal terminals 5*a* and 5*b* during the application process of the adhesive agent which is applied to bond the IC chip 3 or during the IC chip 3 mounting process. If the adhesive agent attaches onto the crystal terminals 5*a* and 5*b*, the conductive connection in the subsequent wiring is disrupted.

The tuning-fork type crystal unit 2, on which surface the IC chip 3 is bonded, is placed in the center of the lead frame 4 disposed on the specified tool. In such a state, an electrical connection is provided by bonding wires between the IC terminals 6 and the wiring parts 4*a* of the lead frame 4, and between the crystal terminals 5*a* and 5*b*.

After providing an electrical connection between the wiring parts 4*a* of the lead frame 4 and the predetermined terminals by the bonding wires, the tuning-fork type crystal unit 2, the IC chip 3, and the wiring parts 4*a* of the lead frame 4 are wrapped (molded) with a resin mold 8.

After the molding, the unnecessary portion of the lead frame 4 is cut off. At the same time as or after the cut off processing, the mounting terminal forming portions 4*b* are folded parallel along the back surface (the surface opposite to the one surface: the other surface) of the tuning-fork type crystal unit 2. As indicated in FIGS. 2A and 2B, this embodiment includes the mounting terminal forming portion 4*b* configured to have a mounting terminal 9 at its free end. The mounting terminal 9 is disposed on the resin mold 8, and is surface-mounted to the base plate of the applying equipment. In this state, product characteristics such as the output frequency are check as necessary.

According to this embodiment, there is no case where the adhesive agent for the IC chip bonding flows over the crystal terminals of the tuning-fork type crystal unit 2, disrupting the wiring. Additionally, preliminarily folding the lead frame 4 to the back surface of the tuning-fork type crystal unit 2 as the mounting terminal avoids the frequency variation when mounted on the wiring board of the applying equipment.

Embodiment 2

Figure 3:
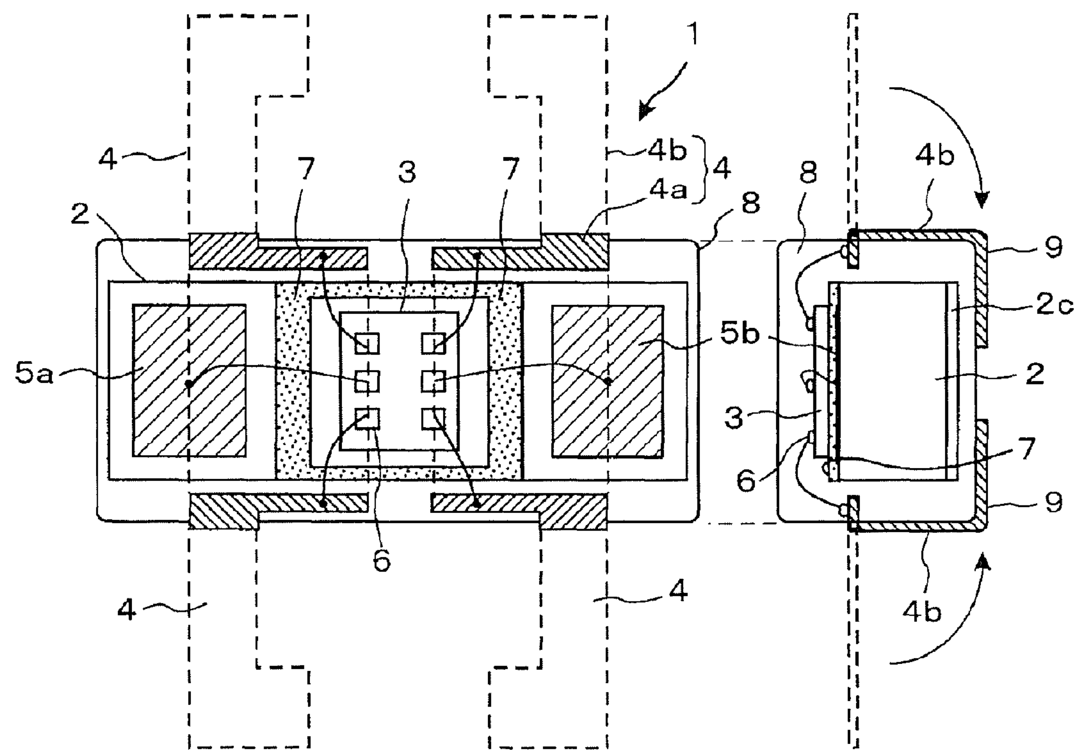
FIG. 3A is a top view illustrating an oscillator according to Embodiment 2 of the disclosure.
FIG. 3B is a side view in a short side illustrating the oscillator according to Embodiment 2 of the disclosure.
Figure 4:
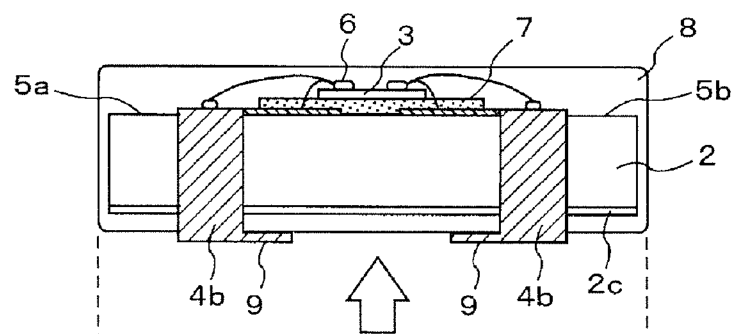
FIG. 4A is a side view in a long side illustrating the oscillator according to Embodiment 2 of the disclosure.
FIG. 4B is a bottom view illustrating the oscillator according to Embodiment 2 of the disclosure.
Figure 4:
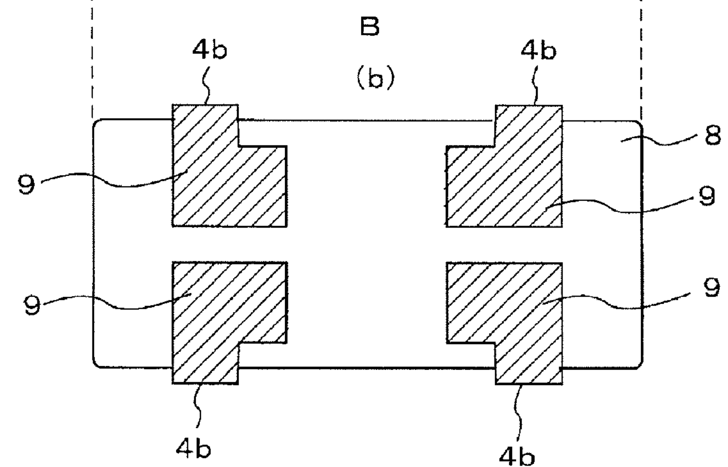

FIGS. 3A and 3B are explanatory drawings of Embodiment 2 of the oscillator according to this disclosure. FIG. 3A is a top view of the oscillator, and FIG. 3B is a side view in the short side of the oscillator. Like FIG. 3A, FIG. 3B, FIGS. 4A, and 4B is explanatory drawings of Embodiment 2 of the oscillator according to this disclosure. FIG. 4A is a side view in the long side viewed from the direction of arrow "A" in FIG. 3A, and FIG. 4B is a bottom view of the oscillator viewed from the direction of arrow "B" in FIG. 4A.

In FIG. 3A, FIG. 3B, FIG. 4A and FIG. 4B, functional portions same as those in Embodiment 1 are designated as the same reference numerals. The difference in the oscillator between Embodiment 1 and Embodiment 2 is the configuration of the adhesive agent flow prevention film 7 disposed between the crystal terminals 5*a*, 5*b* and the IC chip 3. The other configurations are similar to those in Embodiment 1. Hence the explanation is omitted.

The adhesive agent flow prevention film 7 of this embodiment is applied so that the film encloses the outside of the IC chip 3 mounted on the surface of the tuning-fork type crystal unit 2. The method for applying is similar to that in Embodiment 1.

The adhesive agent flow prevention film 7 disposed in the peripheral area of the IC chip 3 not only prevents the applied adhesive agent from flowing over the crystal terminals as is the case of Embodiment 1, but also allows the adhesive agent to flow to the sidewall of the tuning-fork type crystal unit 2, resulting in the increase in the sidewall thickness of the tuning-fork type crystal unit 2. This causes the irregular mold thickness.

As a result, the molded resin coat has unevenness of strength, causing a problem that stress in mounting and environmental temperature change, which occur repeatedly, cause cracking for the mold. As in Embodiment 2, forming the adhesive agent flow prevention film 7 can avoids the problem.

Thus, according to this embodiment, the adhesive agent for bonding the IC chip does not flow over the crystal terminals on the tuning-fork type crystal unit 2, and therefore the wiring is not disrupted. Also, the cracking of the mold, which is generated by the unevenness of strength of molded resin coat, is avoidable. Furthermore, since the lead frame 4 is preliminarily folded on the back surface of the tuning-fork type crystal unit 2 as the mounting terminal, frequency variation, which occurs in mounting on the wiring board of the applying equipment, is avoidable.

Embodiment 3

Figure 5:
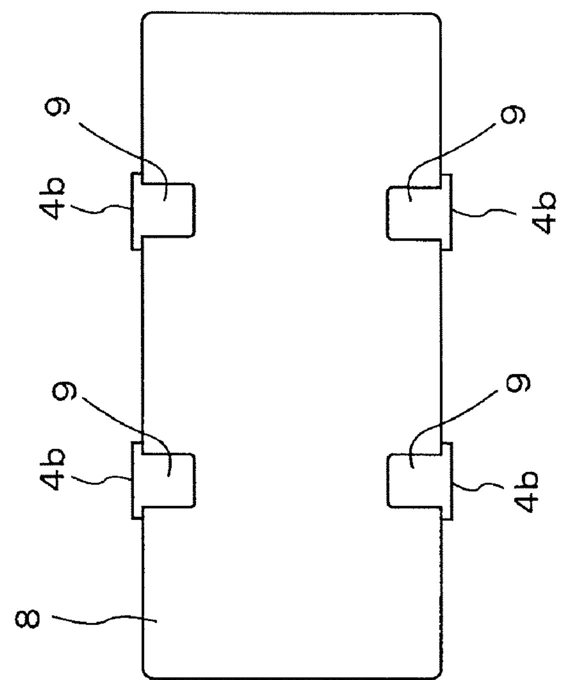
FIG. 5A is a side view in a short side illustrating an oscillator according to Embodiment 3 of the disclosure.
FIG. 5B a bottom view illustrating the oscillator according to Embodiment 3 of the disclosure.
Figure 5:
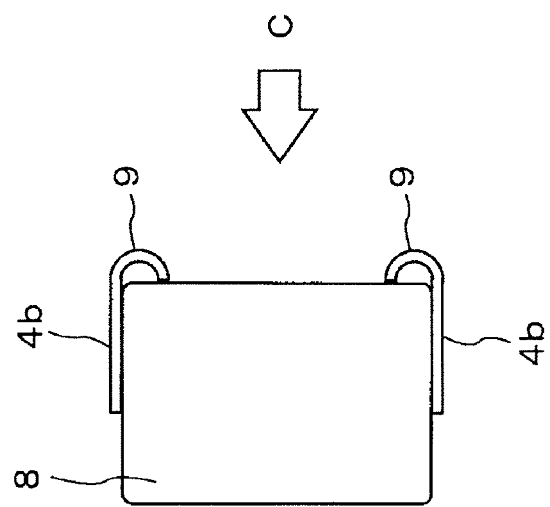

FIGS. 5A and 5B illustrate a side view in the short side and a bottom view describing Embodiment 3 of the oscillator according to this disclosure. FIG. 5A is a side view in the short side of the oscillator in Embodiment 3, and FIG. 5B is a bottom view of the oscillator viewed from the direction of arrow "C" in FIG. 5A. The oscillator according to Embodiment 3 has the structure equal to the tuning-fork crystal unit in any of Embodiment 1 above-described in FIGS. 1A and 1B and Embodiment 2 above-described in FIGS. 3A and 3B.

The feature point of Embodiment 3 which is different from Embodiment 1 and Embodiment 2 is the structure of the mounting terminal. In Embodiment 1 and Embodiment 2, as illustrated in FIGS. 1A and 1B, for example, the structure in which, after the cut off process of the unnecessary portion of the lead frame 4, the mounting terminal forming portion 4*b* is folded parallel along the back surface of the tuning-fork type crystal unit 2 so as to join the mounting terminal 9 formed on its free end and the wiring terminal disposed on the base plate of the applying equipment for the surface-mounting of the oscillator, is employed.

In contrast to this, in Embodiment 3, as illustrated in FIG. 5A, the mounting terminal forming portion 4*b* is curved in a circular arc (J shape from the side view) inward the back surface (the resin mold surface) of the tuning-fork type crystal unit 2 so as to dispose the mounting terminal 9 formed on the end edge in contact with or approximately in contact with the resin mold surface in the back surface.

In Embodiment 3, the terminal surface of the mounting terminal 9, as illustrated in the bottom view of FIG. 5B, has a narrow width shape from the portion which is folded along the bottom surface of the mounting terminal forming portion 4*b*. However, this shape is merely one example. The terminal surface of the mounting terminal 9 can has a large width in plan view as illustrated in FIG. 2A, FIG. 2B, FIG. 3A and FIG. 3B.

Such the terminal shape as in Embodiment 3 ensures good sealing even if there is a slight non-parallel bonding surface when a plurality of mounting terminals are joined to a plurality of the wiring terminals disposed on the base plate of the applying equipment.

FIGS. 6A and 6B are explanatory drawings of the exemplary configuration of the tuning-fork type crystal unit constituting the oscillator according to this disclosure. FIG. 6A is a plan view of the inside of the surface side of the container from which the metal cover is removed. FIG. 6A is a cross-sectional view taken along the line VIB-VIB of FIG. 6A. FIG. 6C is a cross-sectional view taken along the line VIC-VIC of FIG. 6A.

This tuning-fork type crystal unit 2 is configured so that a tuning-fork crystal element (tuning-fork crystal resonator) 2*a* is housed in a container main body 2*b* on which a depressed portion is formed from multi-layer ceramic sheet (the green sheet), and the opening of the depressed portion in the container main body 2*b* is sealed with a metal cover 2*c*. The tuning-fork crystal resonator 2*a* is constituted of tuning-fork arms 21*a* and 21*b* extending parallel from a base portion (a tuning-fork base portion) 21*c*, and the tuning-fork arms 21*a* and 21*b* have a drive electrode (vibration-excitation electrode) and other electrodes to give a desired function. FIGS. 6A and 6B illustrate the tuning-fork type crystal resonator for generating clock signal, each of the tuning-fork arms 21*a* and 21*b* having a vibration-excitation electrode only.

Respective vibration-excitation electrodes formed to the base portion 21*c* are electrically and mechanically secured with a conductive adhesive 2*f* on a crystal holding terminal 2*e* disposed in a pedestal 2*d* formed in the inner wall of the depressed portion of the container main body 2*b*. On the bottom surface of the container main body 2*b*, oscillation signal terminals (the crystal terminals) 5*a* and 5*b*, which electrically connect to the crystal holding terminal 2*e*, are formed.

Figure 7:
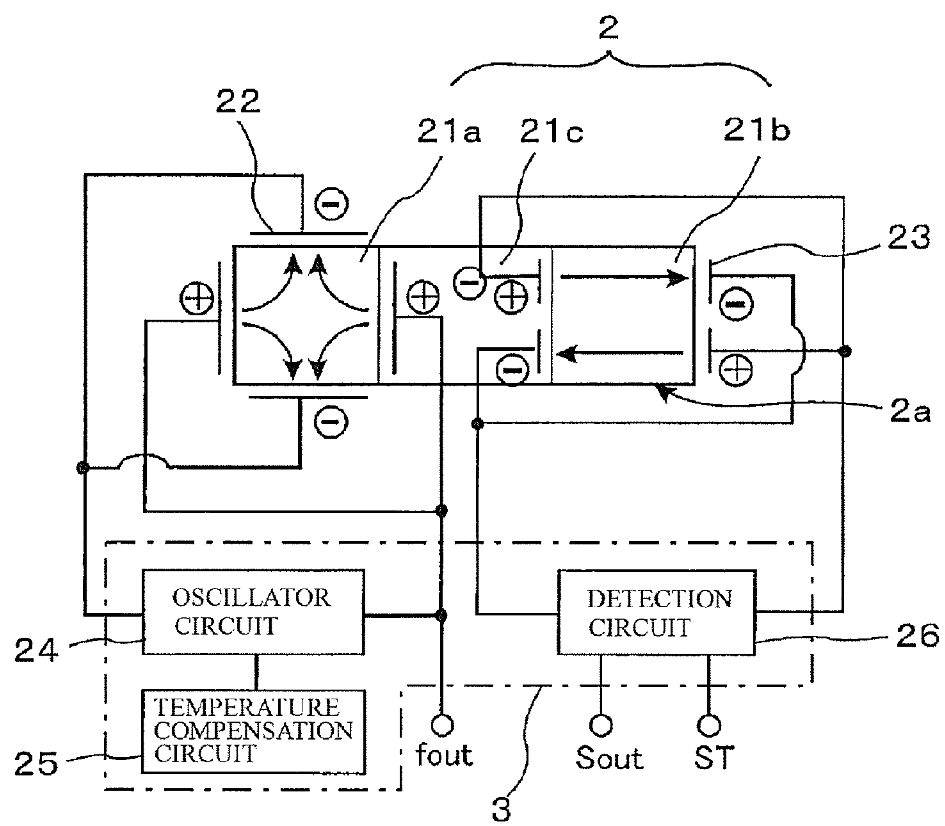
FIG. 7 is a schematic block diagram of the tuning-fork type crystal oscillator having an angular velocity detection mechanism for a camera shake prevention of a camera-embedded mobile terminal which is one application example of the oscillator according to this disclosure.

FIG. 7 is a schematic block diagram of the tuning-fork type crystal oscillator having an angular velocity detection mechanism for the camera shake prevention of the mobile terminal with a camera, or one example of the oscillator according to this disclosure (hereinafter referred to as the tuning-fork type oscillator with angular velocity). The description of the components same as those in the aforementioned embodiments or the conventional examples is simplified or omitted.

This tuning-fork type oscillator with angular velocity has an angular velocity sensor function on the tuning-fork type crystal unit 2 itself. The angular velocity sensor has drive electrodes 22 at one tuning-fork arm 21*a* and sensor electrodes 23 at the other tuning-fork arm 21*b* of the tuning-fork crystal resonator 2*a*. To the drive electrodes 22, an oscillator circuit 24, which excites the tuning-fork vibration, is connected. Then, oscillation output fout is obtained. The oscillation frequency of the tuning-fork crystal resonator 2*a* is the clock source of 32.768 kHz or 16.384 kHz.

To the sensor electrodes 23, a detection circuit 26 is connected to output the angular velocity signal Sout. Here, the detection circuit 26 is operated by a standby signal ST from outside. That is, even if the oscillator circuit 24 always outputs the clock frequency based on the tuning-fork vibration, the angular velocity signal is generated only when the standby signal ST is input. The oscillator circuit 24, a temperature compensation circuit 25 and the detection circuit 26 are integrated on the IC chip 3 illustrated with a chain line frame.

The detail operation of the tuning-fork type oscillator with this angular velocity is as follows. That is, the drive electrodes 22 are disposed at one tuning-fork arm 21*a*, and the sensor electrodes 23 are disposed at the other tuning-fork arm 21*b*. The drive electrodes 22 at the one tuning-fork arm 21*a* are disposed at both principal surfaces and both side surfaces of the tuning-fork arm 21*a*, each of the principal surfaces and the side surfaces having the same electric potential, but having different signs. This allows the one tuning-fork arm 21*a* to generate flexure vibration in order to vibrate the other tuning-fork arm 21*b*, causing a pair of the tuning-fork arms 21*a* and 21*b* to generate the tuning-fork vibration.

The sensor electrodes 23 at the other tuning-fork arm 21*b* are disposed in the internal surface and the outer surface, or the right side and the left side (in FIG. 7, the upper and the lower regions toward the paper) of the tuning-fork arm, 2 pieces in each of the surfaces or the sides facing the opposite surface or side. If such the electrodes have a rotation angle centered on Y-axis (the extending direction of the tuning-fork arm) during the tuning-fork vibration, Coriolis' force causes, between the tuning-fork arms 21*a* and 21*b*, vibration (XZ flexure vibration) in the vertical direction (each being the right angle against Y-axis) or the direction opposite each other to the principal surface.

This, in the other tuning-fork arm 21*b*, causes the tuning-fork crystal resonator 2*a* to have electric fields in the X-axis direction, each of which faces inversely from each other in the upper and lower regions as indicated with the arrow, resulting in the generation of ±electric charges. Then, the sensor electrodes 23 detect these electric charges. The one tuning-fork arm 21*a* also has an electric field, however, there is no sensor electrode to detect it. The electric charges generated at the drive electrodes 22 in both side surfaces are canceled.

The detection circuit 26 is formed from a charge amplifier amplifying an electric charge, a synchronization detecting circuit processing a signal in synchronization with the tuning-fork vibration, and the like, and is integrated on the IC chip 3.

The tuning-fork type crystal unit 2 configured like the above and the IC chip 3 are bonded and integrally molded as mentioned above. The main body housing the crystal resonator was made in the depressed shape from a laminated ceramic sheet, but not limited thereto. It may be made of a quartz-crystal material or a glass material. In such the case, the cover itself can be made of the material identical to that of the main body.

In the above, this disclosure was described with respect to embodiments applied to the temperature compensation oscillator for generating the clock signal of the mobile terminal, but not limited thereto. It is needless to say that this disclosure is applicable to an oscillator, in which various kinds of crystal units and the IC chip constituting an oscillator circuit are integrated, and application components of the oscillator.

It should be noted that an oscillator with an additional application function such as the oscillator with the angular velocity described in FIG. 7 is provided with an additional terminal which enables the mounting terminal described in FIG. 1A to FIG. 6C above to execute the additional application function.

This configuration causes the adhesive agent flow prevention film to block the flow of the adhesive agent over the crystal terminals which occurs upon mounting the IC chip on the applied adhesive agent when the IC chip is bonded to the tuning-fork type crystal unit with the adhesive agent.

The mounting terminal forming portion may include a distal end that constitutes a mounting terminal as it is. The mounting terminal forming portion may include the above-described folded portion that goes through a cut off process of unnecessary portion after the resin molding. Additionally, folding the lead frame to the back surface side of the oscillator in advance avoids increase in parasitic capacitance, inhibiting the variation of the oscillation output frequency. An angular velocity sensor circuit or a similar member is integrated on the IC chip as necessary.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An oscillator, comprising:

a crystal unit where a tuning-fork type crystal resonator is sealed in a flat container rectangular in plan view and a pair of crystal terminals is formed in one surface of the flat container;

an IC chip, a surface opposite to an integrated circuit forming surface of the IC chip being bonded by an adhesive agent between the pair of crystal terminals on the one surface where the crystal terminal in the flat container of the crystal unit is formed, and the crystal unit and the IC chip being coated with a resin mold to render a single electronic component;

an adhesive agent flow prevention film placed between each of the pair of crystal terminals and the IC chip to prevent the adhesive agent from flowing toward the pair of crystal terminals; and a lead frame disposed in a peripheral area of the pair of crystal terminals and the IC chip in an approximately same surface as the one surface of the flat container of the crystal unit, wherein the lead frame includes a wiring part that is connected to an IC terminal of the IC chip by a bonding wire and is buried in the resin mold, and a mounting terminal forming portion that extends from the wiring part and is folded along an outside of the resin mold in a back surface that is another surface side opposite to the one surface of the crystal unit so as to form a mounting terminal.

2. The oscillator according to claim 1, wherein the IC clip includes:

an oscillator circuit configured to oscillate a predetermined frequency using an oscillation signal of the tuning-fork type crystal resonator, and a temperature compensation circuit configured to reduce an oscillation frequency output variation of the oscillator circuit due to change in ambient temperature, as the integrated circuit.

* * * * *